United States Patent
Logan et al.

(10) Patent No.: US 8,709,833 B2
(45) Date of Patent: Apr. 29, 2014

(54) MEASURING CURRENT AND RESISTANCE USING COMBINED DIODES/RESISTOR STRUCTURE TO MONITOR INTEGRATED CIRCUIT MANUFACTURING PROCESS VARIATIONS

(75) Inventors: Lyndon R. Logan, Poughkeepsie, NY (US); Edward J. Nowak, Essex Junction, VT (US); Robert R. Robison, Colchester, VT (US); Jonathan K. Winslow, II, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 13/334,632

(22) Filed: Dec. 22, 2011

(65) Prior Publication Data

US 2013/0161615 A1 Jun. 27, 2013

(51) Int. Cl.
*H01L 21/66* (2006.01)
*G01R 31/26* (2006.01)

(52) U.S. Cl.
USPC ............ 438/17; 438/14; 438/18; 257/48; 257/E21.521; 257/21.524; 324/525; 324/750.01; 324/750.3; 324/762.01; 324/762.07

(58) Field of Classification Search
USPC ............ 438/14, 17, 18; 257/48, E21.521, 257/E21.524; 324/525, 750.01, 750.3, 324/762.07
See application file for complete search history.

(56) References Cited

U.S. PATENT DOCUMENTS

| | | |
|---|---|---|
| 4,170,017 A | 10/1979 | Klein et al. |
| 4,542,340 A | 9/1985 | Chakravarti et al. |
| 4,922,371 A | 5/1990 | Gray et al. |
| 5,485,095 A | 1/1996 | Bertsch et al. |
| 5,801,065 A | 9/1998 | Rizvi et al. |
| 6,320,232 B1 | 11/2001 | Gossner et al. |
| 7,317,324 B2 * | 1/2008 | Watanabe et al. ........ 324/762.02 |
| 7,432,115 B2 | 10/2008 | Kinoshita |
| 7,710,141 B2 | 5/2010 | La Rosa et al. |
| 2006/0238214 A1 | 10/2006 | Itoh |
| 2007/0285104 A1 * | 12/2007 | Cano et al. ..................... 324/537 |
| 2008/0265928 A1 * | 10/2008 | Tsuchiya ........................ 324/763 |
| 2009/0127605 A1 * | 5/2009 | Shiraki et al. ................. 257/296 |
| 2013/0030752 A1 * | 1/2013 | Konmoto ....................... 702/117 |

OTHER PUBLICATIONS

M. Beh et al., "Analysis of HBM and MM ESD failures in nMOS devices," Proceedings of the 1995 5th International Symposium on the Physical and Failure Analysis of Integrated Circuits, Nov. 27-Dec. 1, 1995, pp. 111-115.

(Continued)

*Primary Examiner* — Dao H Nguyen
(74) *Attorney, Agent, or Firm* — Gibb & Riley, LLC; Michael J. LeStrange, Esq.

(57) ABSTRACT

A plurality of diode/resistor devices are formed within an integrated circuit structure using manufacturing equipment operatively connected to a computerized machine. Each of the diode/resistor devices comprises a diode device and a resistor device integrated into a single structure. The resistance of each of the diode/resistor devices is measured during testing of the integrated circuit structure using testing equipment operatively connected to the computerized machine. The current through each of the diode/resistor devices is also measured during testing of the integrated circuit structure using the testing equipment. Then, response curves for the resistance and the current are computed as a function of variations of characteristics of transistor devices within the integrated circuit structure and/or variations of manufacturing processes of the transistor devices within the integrated circuit structure.

18 Claims, 8 Drawing Sheets

(56) References Cited

OTHER PUBLICATIONS

C. Claeys et al., "Processing and Defect Control in Advanced Ge Technologies,". Proceeding of 2007 International Workshop on Electron Devices and Semiconductor Technology, IEDST 2007, Jun. 3-4, 2007, 7 pages.

Application No. GB1221507.5 Examination Report dated Jan. 14, 2014, p. 1.

* cited by examiner

MEASURING CURRENT AND RESISTANCE USING COMBINED DIODES/RESISTOR STRUCTURE TO MONITOR INTEGRATED CIRCUIT MANUFACTURING PROCESS VARIATIONS

BACKGROUND

The present disclosure relates to integrated circuit devices, and more specifically, to measuring current and resistance of integrated circuit devices using combined diodes/resistor structure to monitor integrated circuit manufacturing process variations.

Small changes in the manufacturing process of integrated circuits can have large consequences, which may detrimentally affect the performance of the individual integrated circuit devices. Therefore, it is often useful to include devices that can be tested during or after the manufacturing process. For example, some measurements that are useful when testing integrated circuit devices include resistance and current flow. The testing devices can highlight different performance characteristics that result from changes in the manufacturing process. The devices and methods described below help monitor the changes that occur within integrated circuit devices when the manufacturing process is altered.

SUMMARY

An exemplary method embodiment herein forms a plurality of diode/resistor devices within an integrated circuit structure using manufacturing equipment operatively connected to a computerized machine. Each of the diode/resistor devices comprises a diode device and a resistor device integrated into a single structure. The method measures resistance of each of the diode/resistor devices during testing of the integrated circuit structure using testing equipment operatively connected to the computerized machine. The method also measures current through each of the diode/resistor devices during testing of the integrated circuit structure using the testing equipment. Then, the method computes response curves for the resistance and the current as a function of variations of characteristics of devices within the integrated circuit structure and/or variations of manufacturing processes of the devices within the integrated circuit structure.

Another method embodiment herein partitions an integrated circuit structure into a set of discrete partitions, using a computerized machine. This method forms a plurality of diode/resistor devices within each of the partitions using manufacturing equipment operatively connected to the computerized machine. Each of the diode/resistor devices comprises a diode device and a resistor device integrated into a single structure. The method measures resistance of each of the diode/resistor devices during testing of the integrated circuit structure using testing equipment operatively connected to the computerized machine. The method also measures current through each of the diode/resistor devices during testing of the integrated circuit structure using the testing equipment. Then, the method computes the median resistance and median current for each of the partitions based on the resistance and the current for each of the diode/resistor devices within each of the partitions (using the computerized machine). The method also computes, using the computerized machine, response curves for the median resistance and the median current as a function of: variations of characteristics of transistor devices within the integrated circuit structure (including gate length variation and/or spacer size variation); and/or variations of manufacturing processes of the transistor devices within the integrated circuit structure (including rapid thermal anneal variations and/or implant variations).

An integrated circuit structure embodiment herein comprises a plurality of diode/resistor devices within an integrated circuit structure. Each of the diode/resistor devices comprises a cathode having a length dimension, sides parallel to the length dimension, and opposing ends located where the length dimension begins and terminates. Further, anodes are positioned along the sides of the cathode. The cathode and anodes form a diode device. The resistor device is located along the length dimension of the cathode. Further, connections to the anodes yield a current measure, and connections to the relatively deep diffusion regions yield a resistance measure.

Another integrated circuit structure embodiment herein comprises a plurality of diode/resistor devices within each of a plurality of partitions of the integrated circuit structure. Each of the diode/resistor devices comprises a cathode having a length dimension, sides parallel to the length dimension, and opposing ends located where the length dimension begins and terminates. Further, anodes are positioned along the sides of the cathode. Relatively deep diffusion regions are located at the opposing ends of the cathode, and a relatively shallow diffusion region (that has a depth in the integrated circuit structure that is less than the relatively deep diffusion regions) is located between the relatively deep diffusion regions. The cathode and anodes form a diode device. The resistor device is located along the length dimension of the cathode and the resistance measure is correspondingly measured along a length of the cathode region. Further, connections to the anodes yield a current measure, and connections to the relatively deep diffusion regions yield a resistance measure.

BRIEF DESCRIPTION OF THE DRAWINGS

The embodiments herein will be better understood from the following detailed description with reference to the drawings, which are not necessarily drawing to scale and in which.

DETAILED DESCRIPTION

As mentioned above, the devices and methods described below help monitor the changes that occur within integrated circuit devices when the manufacturing process is altered (intentionally or unintentionally). More specifically, in the embodiments described herein, a plurality of diode/resistor devices are formed within an integrated circuit structure using integrated circuit tools and manufacturing equipment. Each of the diode/resistor devices includes a diode device and a resistor device that are integrated into a single structure (that share components within a single structure), rather than using separate resistors and diodes that may be positioned some inconsistent distances from each other. Because the resistor and diode devices are internal within the same single structure, any performance variation is always self-consistent and the output response always shows correct correlation.

Therefore, such integrated diode/resistor devices (which are principally used for manufacturing testing proposes) provide a more representative indication of the affect manufacturing process variations will have on other circuit elements (which are principally used to perform the intended function of the integrated circuit device) because the integrated diode/resistor devices have uniformly spaced resistor and diode devices and even share components. To the contrary, separate resistors and diodes would not be uniformly spaced and would not share components, making the results from such separate devices less consistent and less representative of other circuit elements than the integrated diode/resistor devices herein. This allows the integrated diode/resistor devices to monitor for manufacturing process variations in a very accurate manner.

The resistance and current change experienced by the diode/resistor devices disclosed herein is representative of the change that occurs in the other non-test, functional circuit elements (such as transistors, capacitors, etc.) because the diode/resistor devices and the non-test circuit elements are made simultaneously (during the same processing steps). For example, the impurities used to form the diode and resistor are implanted simultaneously with the implantation of impurity regions within the non-test circuit elements (such as well regions, source drain regions, etc.). Similarly, conductors and spacers of the diode and resistor are formed simultaneously with wiring elements and gate conductors of the transistors of the other circuit elements. Therefore, any change that occurs to the non-test circuit elements will similarly occur in the diode/resistor device, allowing the integrated diode/resistor devices to monitor for manufacturing process variations very precisely.

The resistance of each of the diode/resistor devices is measured during testing of the integrated circuit structure using testing equipment. The current through each of the diode/resistor devices is also measured during testing of the integrated circuit structure using the testing equipment. Then, response curves for the resistance and the current are computed as a function of variations of characteristics of the non-test devices within the integrated circuit structure and/or variations of manufacturing processes of the transistor devices within the integrated circuit structure.

Figure 1:
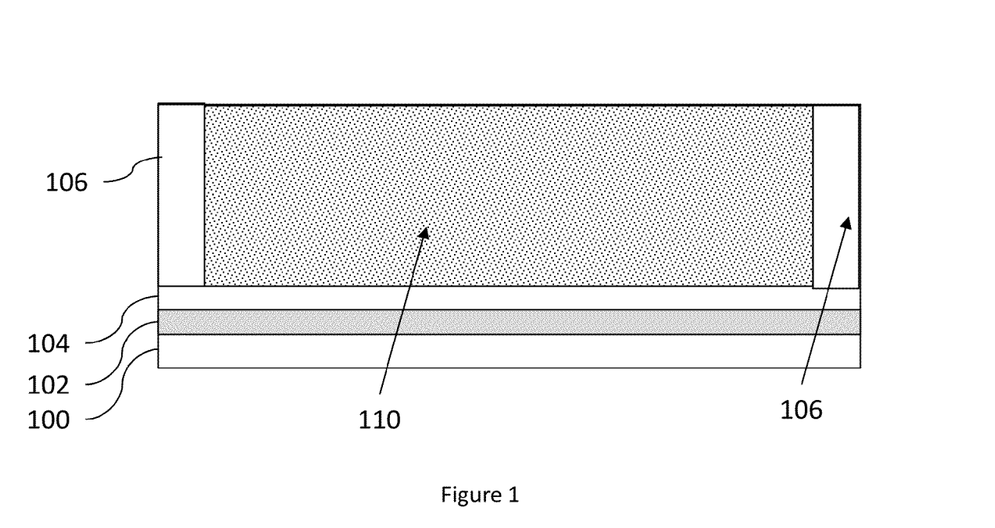
FIG. 1 is a schematic cross-sectional diagram illustrating embodiments herein.

Generally, transistor structures are formed by depositing, growing, or implanting impurities into a substrate. As used herein, "implantation processes" can take any appropriate form (whether now known or developed in the future) and can comprise, for example, ion implantation, etc. Thus, FIG. 1 illustrates an integrated circuit device that includes a substrate, such as a silicon-on-insulator (SOI) substrate. A "substrate" herein can comprise any material appropriate for the given purpose (whether now known or developed in the future) and can comprise, for example, Si, SiC, SiGe, SiGeC, or organic structures, etc. The substrate can include an underlying substrate layer 100 that is isolated from the remainder of the substrate 104 by an insulator 102. This insulator 102 is often an oxide and is therefore commonly referred to as a buried oxide layer (BOX).

The sides of the diode/resistor device are isolated from adjacent devices by shallow trench isolation (STI) structures 106. The shallow trench isolation structures are generally formed by patterning openings/trenches within the substrate and growing or filling the openings with a highly insulating material (this allows different active areas of the substrate to be electrically isolated from one another). Further, an overlying insulator can be formed to electrically isolate the diode/resistor device 202 from devices in adjacent layers of a multilayer structure.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides, such as tantalum oxide. The thickness of dielectrics herein may vary contingent upon the required device performance.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

In this example, the diode will be described as a P-N-P diode having P-type anodes and an N-type cathode. However, while a P-N-P diode is described herein, those ordinarily skilled in the art would understand that a N-P-N diode could also be formed merely by reversing the polarity of the dopants. As mentioned above, the various impurity regions shown in the drawings can be formed by implantation, deposition, growth processes, etc.

Therefore, as shown in FIG. 1, an underlying well region 110 can be initially formed within the upper portion of the substrate 104. In this example of a P-N-P diode, such a well region 110 would comprise N-type impurities, such as antimony, arsenic or phosphorous, etc., and the opposite polarity impurity regions could comprise P-type impurities such as boron, aluminum or gallium, etc.

Figure 2:
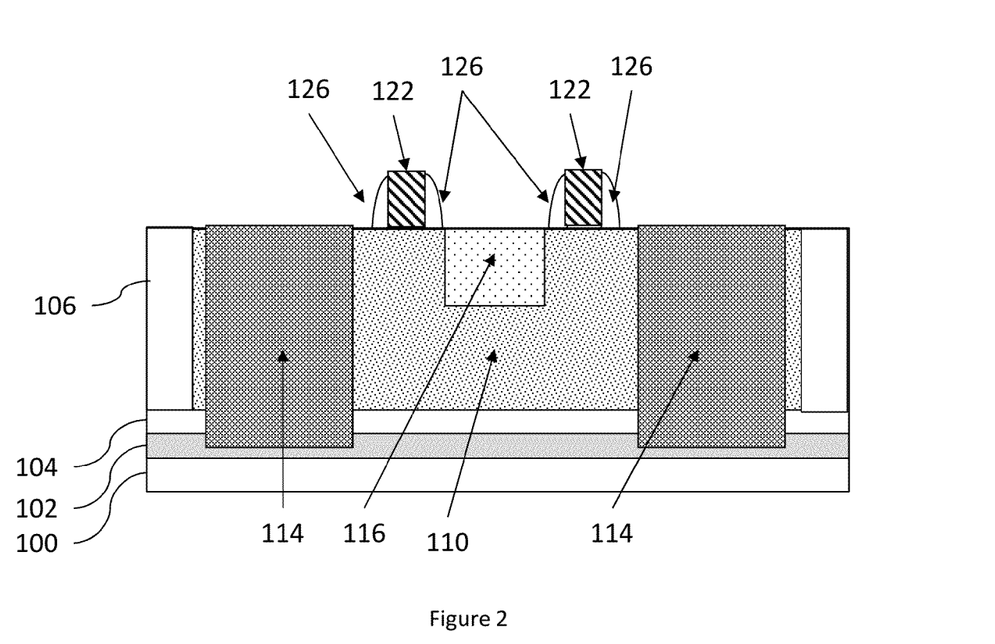
FIG. 2 is a schematic cross-sectional diagram illustrating embodiments herein.

Further, as shown in FIG. 2, various structures such as conductors 122 and sidewall spacers 126 formed on such conductors 122 (which are not necessarily used in this structure, but are used in other devices within the overall integrated circuit structure) are used to self-align the formation of the various impurity regions. For purposes herein, "sidewall spacers" are structures are generally formed by depositing or growing a conformal insulating layer (such as any of the insulators mentioned above) and then performing a directional etching process (anisotropic) that etches material from horizontal surfaces at a greater rate than it removes material from vertical surfaces, thereby leaving insulating material along the vertical sidewalls of structures. This material left on the vertical sidewalls is referred to as sidewall spacers.

As shown in FIG. 2, the relatively shallow diffusion region 116 can then be formed and (again, in this example of a P-N-P diode) comprises N-type impurities. Relatively deep diffusion regions 118 (shown in FIG. 5) comprise the same type of impurity; however, the relatively deep diffusion impurities 118 are formed at a greater concentration and/or deeper within the substrate 104 relative to the shallow diffusion region 116.

Figure 3:
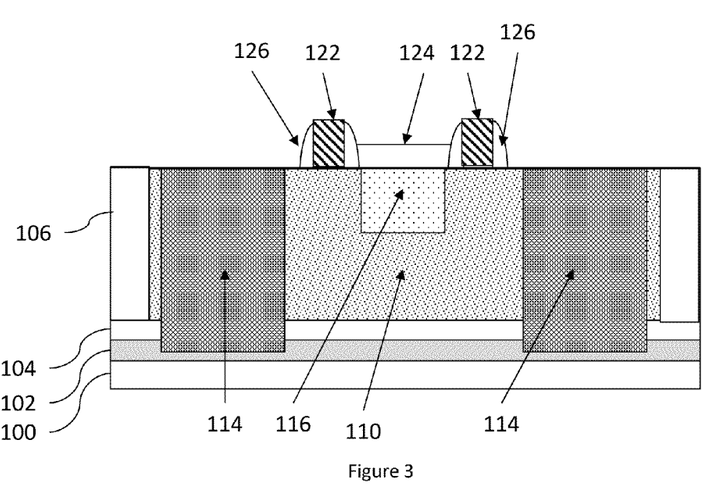
FIG. 3 is a schematic cross-sectional diagram illustrating embodiments herein along line B-B' shown in FIG. 4.
Figure 4:
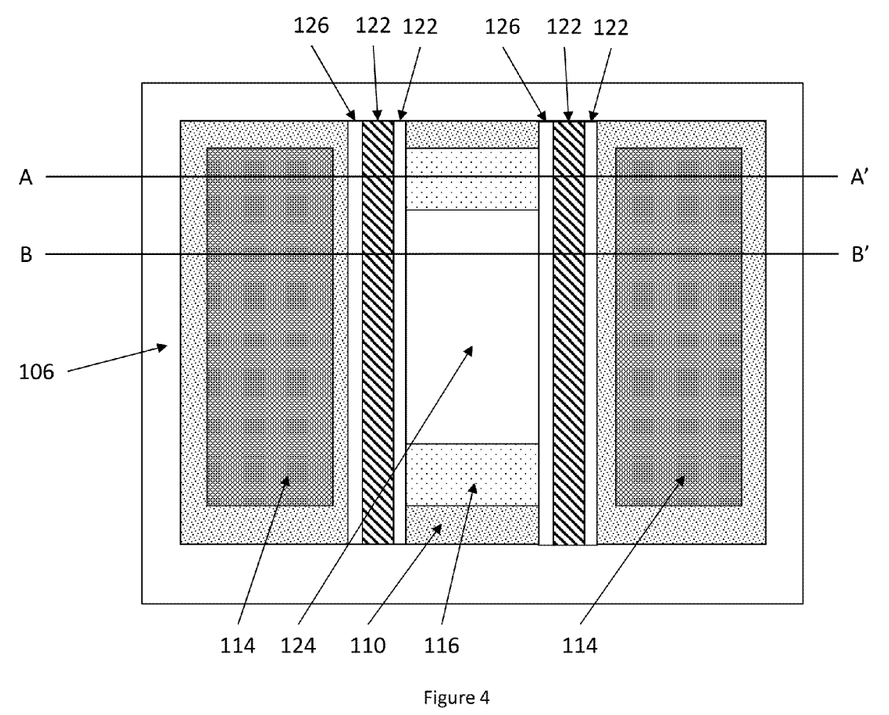
FIG. 4 is a schematic top-view diagram illustrating embodiments herein.

The depth and impurity concentration distinction between the relatively shallow diffusion region 116 and the relatively deep diffusion regions 118 is accomplished, for example, through the use of a protective layer 124 shown in FIGS. 3 and 4, such as a nitride layer. From the top view shown in FIG. 4 (where FIG. 3 is a schematic cross-sectional diagram along line B-B' shown in FIG. 4) the protective layer 124 matches the shape of the relatively shallow diffusion region 116 shown in FIG. 1. The protective layer 124 is formed after the relatively shallow diffusion region is formed.

Figure 5:
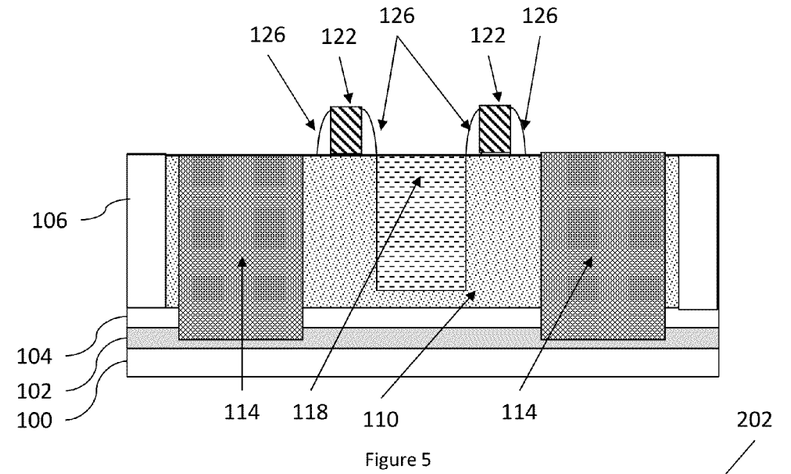
FIG. 5 is a schematic cross-sectional diagram illustrating embodiments herein along line A-A' shown in FIG. 4.

Further, the protective layer 124 protects the relatively shallow diffusion region 116 from additional subsequent impurity doping processes that form the relatively deep diffusion region 118 into regions of the substrate 104 that are not protected by the protective layer 124 or the conductors spacers 122, 126, etc., as shown in FIG. 5. FIG. 5 is a schematic cross-sectional diagram along line A-A' shown in FIG. 4 after processes that change the exposed portions of the relatively shallow diffusion region 116 shown in FIG. 4 into relatively deep diffusion regions 118.

Figure 6:
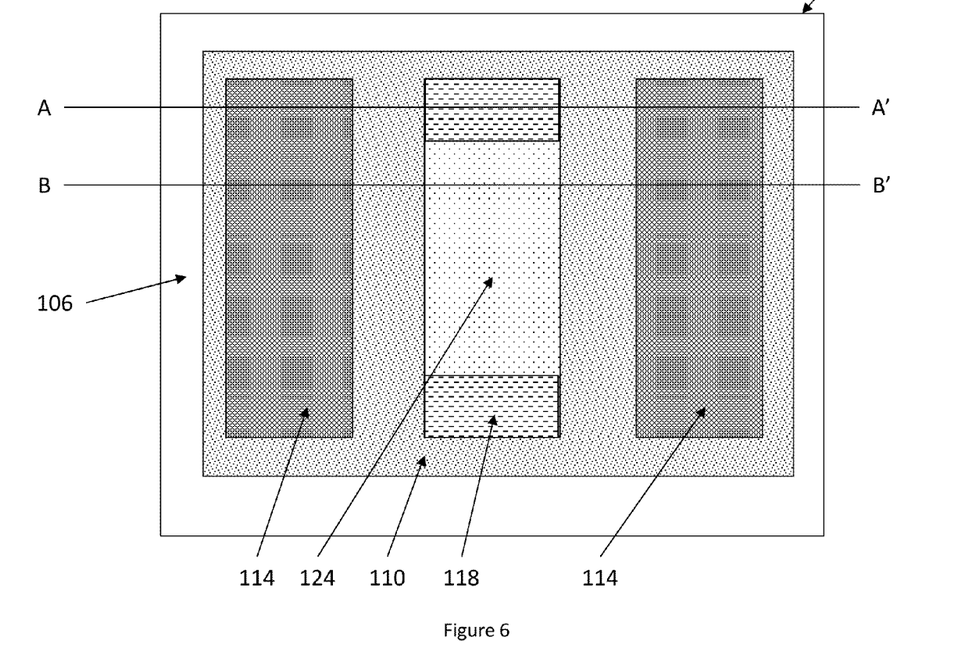
FIG. 6 is a schematic top-view diagram illustrating embodiments herein along line C-C' shown in FIGS. 7 and 8.
Figure 7:
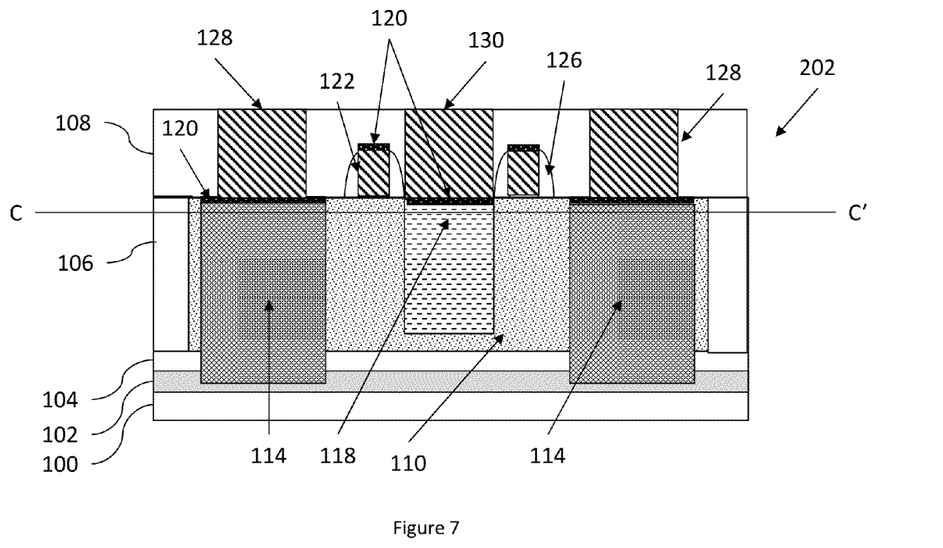
FIG. 7 is a schematic cross-sectional diagram illustrating embodiments herein along line A-A' shown in FIG. 6.
Figure 8:
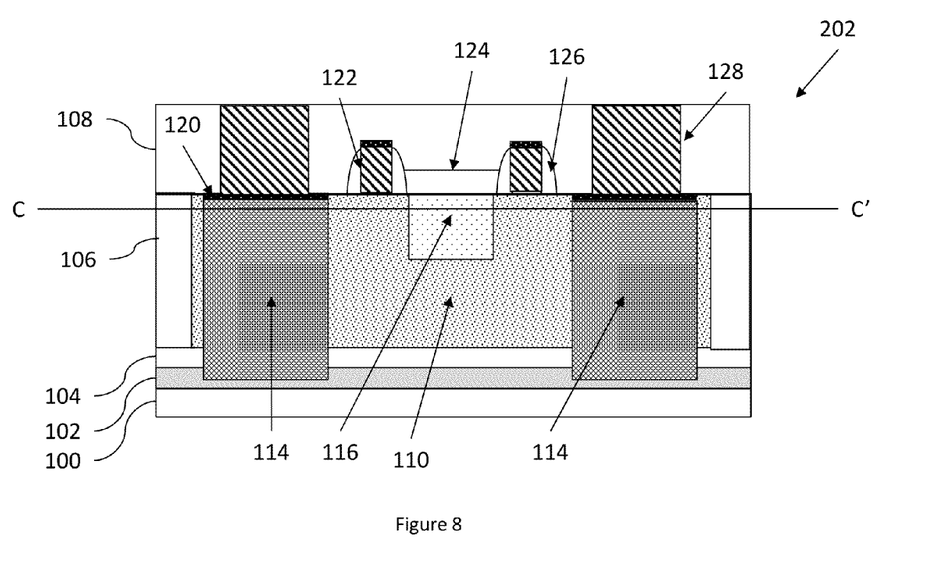
FIG. 8 is a schematic cross-sectional diagram illustrating embodiments herein along line B-B' shown in FIG. 6.
Figure 9:
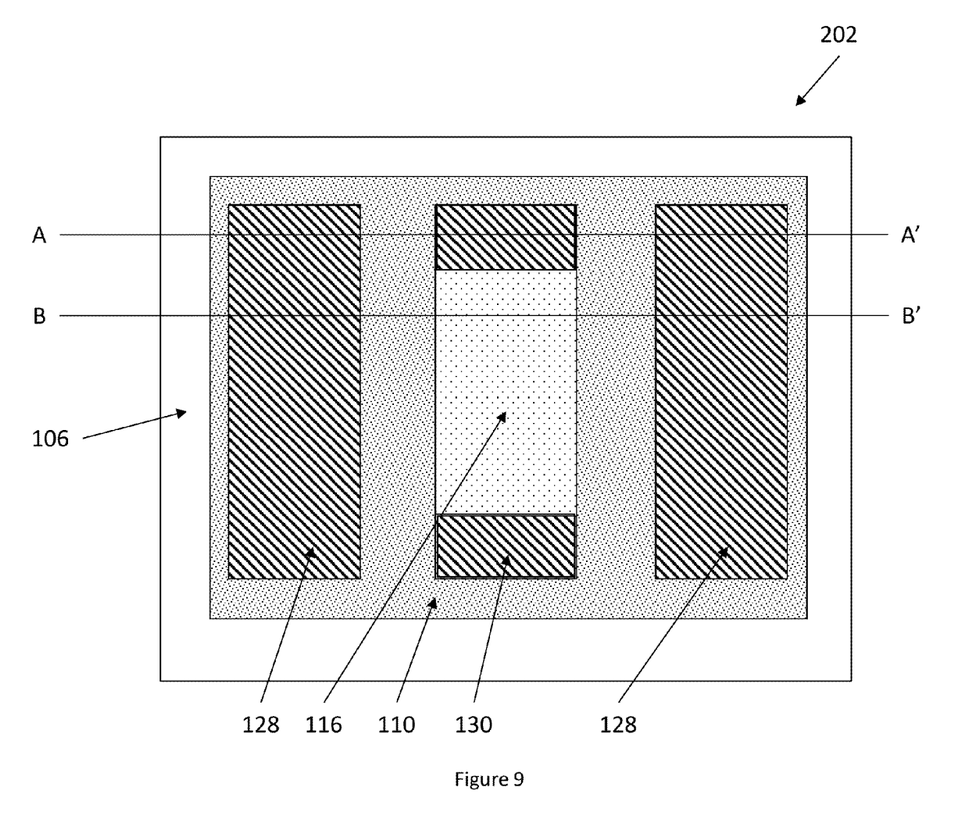
FIG. 9 is a schematic top-view diagram illustrating embodiments herein.

Referring now to the drawings of the completed structure, FIGS. 6-10 illustrate one example of a diode/resistor device that can be utilized herein. More specifically, FIG. 6 is a schematic top-view diagram of a diode/resistor device herein (along line C-C' shown in FIGS. 7-8). Further, FIG. 7 is a schematic cross-sectional diagram along line A-A' shown in FIG. 6; and FIG. 8 is a schematic cross-sectional diagram along line B-B' shown in FIG. 6. FIG. 9 is a similar view to that shown in FIG. 6, except that in FIG. 9, the diode contacts 128 and the resistor contacts 130 are shown over the structure illustrated in FIG. 6 to illustrate the location of such contacts.

The diode/resistor device 202 includes a cathode 116/118. The cathode 116/118 has a length dimension running from the top of the page to the bottom of the page in the view shown in FIG. 6. The cathode 116/118 also has sides parallel to the length dimension, and opposing ends located where the length dimension begins and terminates. Anodes 114 are positioned along the sides of the cathode 116/118. The cathode 116/118 and anodes 114 form a diode device that can be used to measure current (or reverse current, etc.).

More specifically, within the cathode, the relatively deep diffusion regions 118 are located at the opposing ends of the cathode, and the relatively shallow diffusion region 116 (that has a depth in the integrated circuit structure that is less than the relatively deep diffusion regions 118 as shown in FIGS. 7 and 8) is located between the relatively deep diffusion regions 118.

As mentioned above, the anodes 114 are formed by forming P-type impurity regions 114. Silicide 120 can be formed over regions not protected by the protective layer 124 or the conductors 122, spacers 126, etc. Therefore, the silicide 120 is located at the top of each anode 114 region, at the top of each relatively deep diffusion region 118, and at the tops of the conductors 122, as shown in FIGS. 7 and 8.

Anode contacts (sometimes referred to herein as first conductive contacts) 128 are patterned to be connected to the anodes 114 and second contacts 130 (that are separate from the first contacts 128) are connected to the relatively deep diffusion regions 118. The positions of these two pairs of contacts (one pair of which measures current, and the other pair of which measures resistance) are also shown overlaid in FIG. 9 on the structure shown in FIG. 6. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

The current measure is measured through the first contacts 128 and the resistance measure is measured through the second contacts 130. The diode device 114, 116 and the resistor device 116, 118 within each of the diode/resistor devices 202 share the relatively shallow diffusion region 116 of the cathode. The resistor device 116, 118 is located along the length dimension of the cathode 116/118 and the corresponding resistance measure is measured along the length of the cathode 116/118 region. Further, connections to the anodes 114 yields the current measure from the diode device 114, 116.

Each of the diode/resistor devices 202 are identical to all other diode/resistor devices 202. The diode device 114, 116 and the resistor device 116, 118 within each of the diode/resistor devices 202 are independently operable, and the resistance and current can be measured in independent processes (or can be measured simultaneously). The diode/resistor devices 202 comprise a cathode region 116/118, and the resistance is measured along the length of the cathode region 116/118. The diode device 114, 116 and the resistor device 116, 118 within each of the diode/resistor devices 202 share internal components. Again, the diode/resistor devices 202 have first contacts 128 and second contacts 130 that are separate from each other, and the current is measured through the first contacts 128 and the resistance is measured through the second contacts 130.

Figure 10:
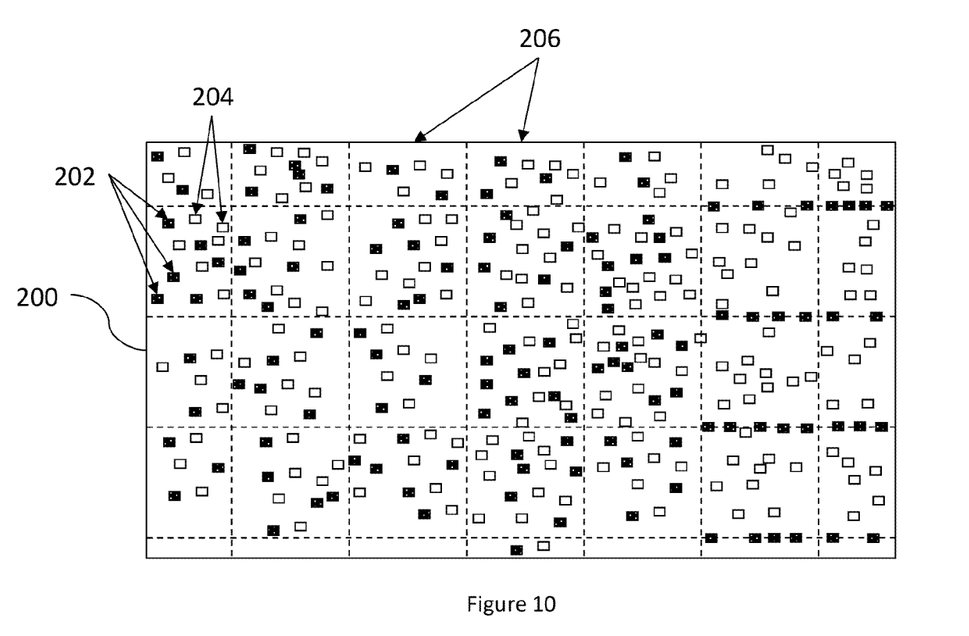
FIG. 10 is a schematic top-view diagram illustrating embodiments herein.
Figure 11:
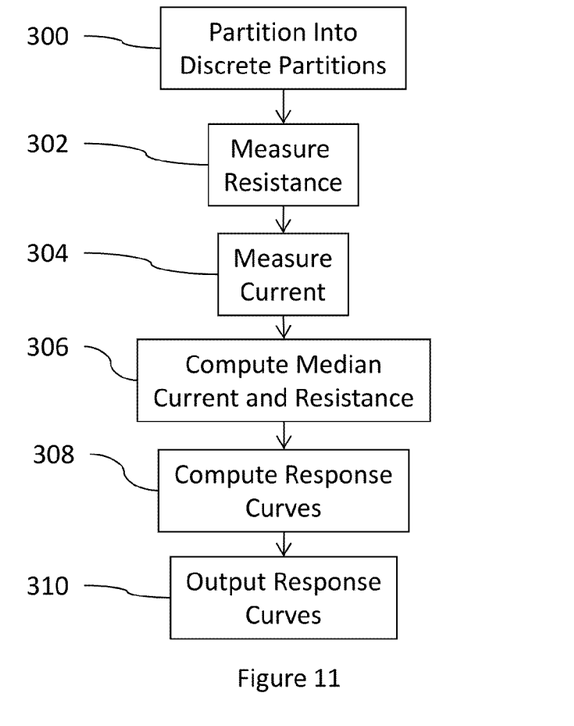
FIG. 11 is a flow diagram illustrating embodiments herein.

As shown in flowchart form in FIG. 11, in conjunction with the structure shown in FIG. 10, an exemplary method embodiment herein partitions 300 an integrated circuit structure 200 into a set of discrete partitions 206 (bordered using dashed lines in FIG. 10) using a computerized machine. This method forms a plurality of diode/resistor devices 202 within each of the partitions simultaneously with non-test circuit elements 204 (transistors, capacitors, diodes, resistors, wiring structures, etc.) using manufacturing equipment operatively connected to the computerized machine. The diode/resistor devices 202 can be formed among the non-test circuit elements 204 as shown in the center and left side of FIG. 10, or can be formed along kerf regions (which may or may not correspond to the partition dividing lines) as shown in the right side of FIG. 10.

In item 302, methods herein measure resistance of each of the diode/resistor devices during testing of the integrated circuit structure using testing equipment operatively connected to a computerized machine. In item 304, methods herein measure current through each of the diode/resistor devices during testing of the integrated circuit structure using the testing equipment.

Then, in item 306, the methods herein can compute the median resistance and median current for each of the partitions 206 based on the resistance and the current for each of the diode/resistor devices within each of the partitions 206

Figure 13:
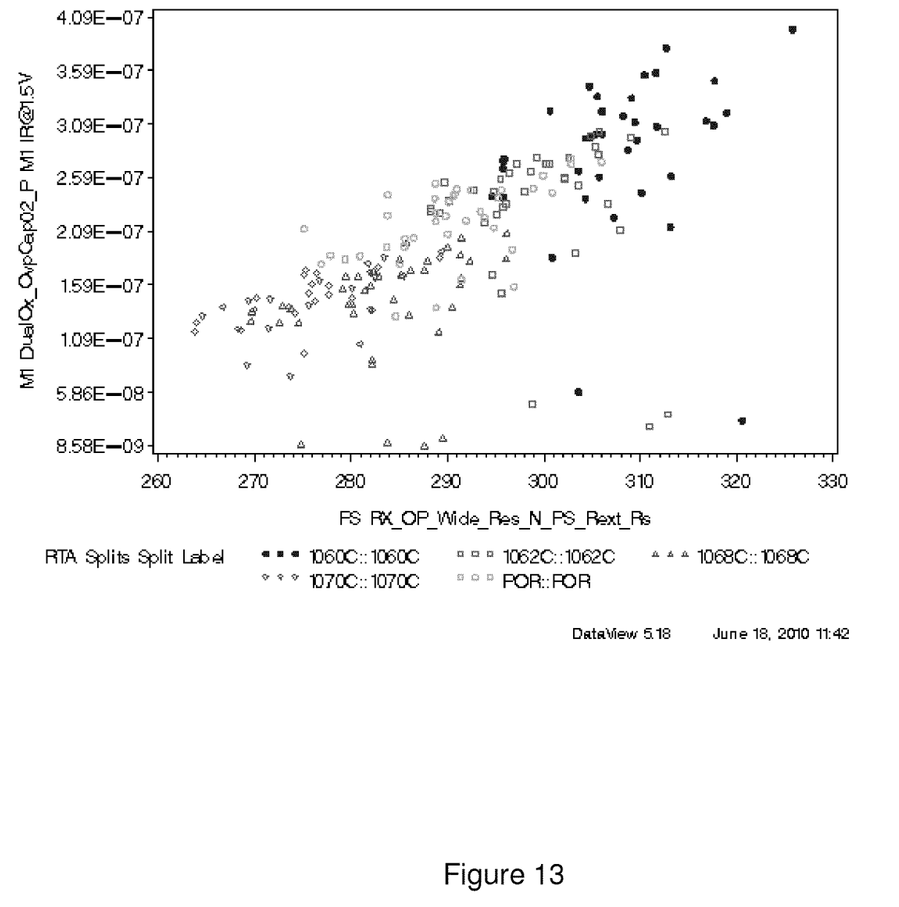
FIG. 13 is a plot showing a representative response curve produced by embodiments herein.

(using the computerized machine). The method also computes, using the computerized machine in item 308, response curves for the median resistance and the median current as a function of: variations of characteristics of transistor devices within the integrated circuit structure (including gate length variation and/or spacer size variation); and/or variations of manufacturing processes of the transistor devices within the integrated circuit structure (including rapid thermal anneal variations and/or implant variations). A representative response curve is shown in FIG. 13. The response curves are output from the computerized machine in item 310.

In item 308 when generating the response curves the structures and methods herein provide a plot for resistance and/or current for a given set of variables (gate length, spacer size, rapid thermal anneal characteristics, implant species, implant power, etc.). When these variables change, the plot for resistance and current will also change and the nature of that change indicates the affect that changing the manufacturing variables produces on not only the diode/resistor devices 202, but also on the non-test circuit elements 204.

The resistance and current change experienced by the diode/resistor devices 202 is representative of the change that occurs in the non-test circuit elements 204 because the diode/resistor devices 202 are made during the same processing steps. For example, the impurities used to form the diode 114/116 and resistor 116/118 discussed above are formed simultaneously with the formation of impurity regions within the non-test circuit elements 204. Similarly, the conductors 122 and spacers 126 are formed simultaneously with wiring elements and gate conductors of the transistors of the non-test circuit elements 204.

Therefore, when the formation of the impurities changes in the non-test circuit elements 204, the same change occurs in the diode/resistor devices 202. Similarly, when the gate length of the conductor 122 or the spacers size 126 changes in the non-test circuit elements 204, the same change occurs in the diode/resistor devices 202. This allows the diode/resistor devices 202 to provide an accurate representation of the change in current and resistance within the non-test circuit elements 204. Thus, the methods and structures herein provide and utilize an integrated diode/resistor device in order to accurately allow circuit designers to quickly and easily know the effect that manufacturing changes will have on the integrated circuit devices being manufactured, and to identify situations where the manufacturing parameters may have inadvertently changed.

Figure 12:
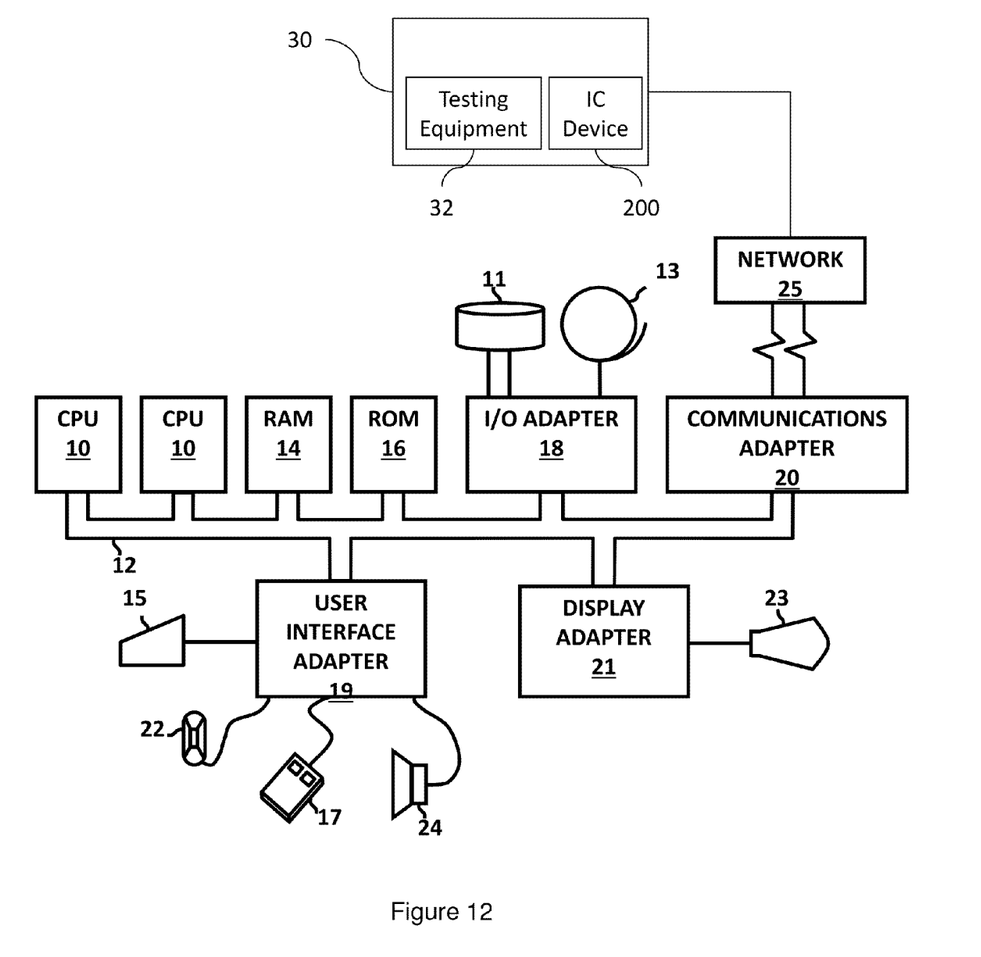
FIG. 12 is a schematic diagram of a hardware system according to embodiments herein.

A representative hardware environment for practicing the embodiments herein is depicted in FIG. 12. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example. A testing device 30 having testing equipment 32 that tests integrated circuit devices 200 is connected to the processors 10 through, for example, the network 25.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
forming a plurality of diode/resistor devices within an integrated circuit structure using manufacturing equipment operatively connected to a computerized machine, each of said diode/resistor devices comprising a diode device and a resistor device integrated into a single structure;
measuring resistance of each of said diode/resistor devices during testing of said integrated circuit structure using testing equipment operatively connected to said computerized machine;
measuring current through each of said diode/resistor devices during testing of said integrated circuit structure using said testing equipment; and
computing median resistance and median current based on said resistance and said current for each of said diode/resistor devices, using said computerized machine;
computing, using said computerized machine, response curves for said median resistance and said median current as a function at least one of:
variations of characteristics of transistor devices within said integrated circuit structure including at least one of gate length variation and spacer size variation; and
variations of manufacturing processes of said transistor devices within said integrated circuit structure including at least one of rapid thermal anneal variations, and implant variations.

2. The method according to claim 1, said diode device and said resistor device within each of said diode/resistor devices being independently operable, and said measuring of said resistance and said measuring of said current comprising independent processes.

3. The method according to claim 1, said diode/resistor devices comprising first contacts and second contacts separate from said first contacts, said current being measured through said first contacts and said resistance being measured through said second contacts.

4. The method according to claim 1, said diode device and said resistor device within each of said diode/resistor devices sharing internal components.

5. The method according to claim 1, said diode/resistor devices comprising a cathode region, said resistance being measured along a length of said cathode region.

6. The method according to claim 1, each of said diode/resistor devices being identical to all other diode/resistor devices.

7. A method comprising:
partitioning an integrated circuit structure into a set of discrete partitions, using a computerized machine;
forming a plurality of diode/resistor devices within each of said partitions using manufacturing equipment operatively connected to said computerized machine, each of said diode/resistor devices comprising a diode device and a resistor device integrated into a single structure;
measuring resistance of each of said diode/resistor devices during testing of said integrated circuit structure using testing equipment operatively connected to said computerized machine;
measuring current through each of said diode/resistor devices during testing of said integrated circuit structure using said testing equipment;
computing median resistance and median current for each of said partitions based on said resistance and said current for each of said diode/resistor devices within each of said partitions, using said computerized machine;
computing, using said computerized machine, response curves for said median resistance and said median current as a function at least one of:
variations of characteristics of transistor devices within said integrated circuit structure including at least one of gate length variation and spacer size variation; and
variations of manufacturing processes of said transistor devices within said integrated circuit structure including at least one of rapid thermal anneal variations, and implant variations.

8. The method according to claim 7, said diode device and said resistor device within each of said diode/resistor devices being independently operable, and said measuring of said resistance and said measuring of said current comprising independent processes.

9. The method according to claim 7, said diode/resistor devices comprising first contacts and second contacts separate from said first contacts, said current being measured through said first contacts and said resistance being measured through said second contacts.

10. The method according to claim 7, said diode device and said resistor device within each of said diode/resistor devices sharing internal components.

11. The method according to claim 7, said diode/resistor devices comprising a cathode region, said resistance being measured along a length of said cathode region.

12. The method according to claim 7, each of said diode/resistor devices being identical to all other diode/resistor devices.

13. A method comprising:
partitioning an integrated circuit structure into a set of discrete partitions, using a computerized machine;
forming a plurality of diode/resistor devices within each of said partitions using manufacturing equipment operatively connected to said computerized machine, each of said diode/resistor devices comprising a diode device and a resistor device integrated into a single structure;
measuring resistance of each of said diode/resistor devices during testing of said integrated circuit structure using testing equipment operatively connected to said computerized machine;
measuring current through each of said diode/resistor devices during testing of said integrated circuit structure using said testing equipment;
computing median resistance and median current for each of said partitions based on said resistance and said current for each of said diode/resistor devices within each of said partitions, using said computerized machine;
computing, using said computerized machine, response curves for said median resistance and said median current as a function at least one of:
variations of characteristics of transistor devices within said integrated circuit structure; and
variations of manufacturing processes of said transistor devices within said integrated circuit structure.

14. The method according to claim 13, said diode device and said resistor device within each of said diode/resistor devices being independently operable, and said measuring of said resistance and said measuring of said current comprising independent processes.

15. The method according to claim 13, said diode/resistor devices comprising first contacts and second contacts separate from said first contacts, said current being measured through said first contacts and said resistance being measured through said second contacts.

16. The method according to claim 13, said diode device and said resistor device within each of said diode/resistor devices sharing internal components.

17. The method according to claim 13, said diode/resistor devices comprising a cathode region, said resistance being measured along a length of said cathode region.

18. The method according to claim 13, each of said diode/resistor devices being identical to all other diode/resistor devices.

* * * * *